United States Patent
Barrenscheen et al.

(10) Patent No.: US 8,841,940 B2
(45) Date of Patent: Sep. 23, 2014

(54) SYSTEM AND METHOD FOR A DRIVER CIRCUIT

(71) Applicant: Infineon Technologies Austria AG, Villach (AT)

(72) Inventors: Jens Barrenscheen, Munich (DE); Laurent Beaurenaut, Neubiberg (DE); Marcus Nuebling, Olching Esting (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/760,676

(22) Filed: Feb. 6, 2013

(65) Prior Publication Data
US 2014/0218097 A1 Aug. 7, 2014

(51) Int. Cl.
*H03B 1/00* (2006.01)
*H03K 3/00* (2006.01)
*H02M 3/337* (2006.01)

(52) U.S. Cl.
CPC .................................. *H02M 3/3376* (2013.01)
USPC ........... 327/108; 327/109; 327/110; 327/111; 327/112

(58) Field of Classification Search
CPC .. H02M 3/3376; H03F 1/0233; H03G 3/3042
USPC .................................. 327/108, 109, 110, 112
See application file for complete search history.

(56) References Cited

U.S. PATENT DOCUMENTS

2002/0093366 A1* 7/2002 Fotouhi .......................... 327/108

* cited by examiner

*Primary Examiner* — John Poos
(74) *Attorney, Agent, or Firm* — Slater & Matsil, L.L.P.

(57) ABSTRACT

In accordance with an embodiment, a method of operating a gate driving circuit includes monitoring a signal integrity at an output of the gate driving circuit. If the signal integrity is poor based on the monitoring, output of the gate driving circuit is placed in a high impedance state and an external signal integrity failure signal is asserted.

21 Claims, 6 Drawing Sheets

SYSTEM AND METHOD FOR A DRIVER CIRCUIT

TECHNICAL FIELD

This invention relates generally to semiconductor circuits and methods, and more particularly to a system and method for a driver circuit.

BACKGROUND

In electronic systems such as power supplies, motor controllers, and electrical distribution networks, high voltage power transistors are used in high current paths to switch currents. Recent improvements in semiconductor device technology has allowed for high power transistors that switch faster and dissipate less power during operation. Two common power transistor types are the metal-oxide semiconductor field-effect transistor (MOSFET), and the integrated gate bipolar transistor (IGBT). While both transistor types can be manufactured to handle large amounts of current, care must be taken in operating the transistors to avoid destruction of the device during normal operation and during electrostatic discharge (ESD) events. As such, power MOSFETs and IGBTs are commonly driven using specialized gate driver circuits that manages the gate voltage of the MOSFET or IGBT in order to prevent over-voltage of the gate and/or latch up of the device.

In very high power applications, such as those used in hybrid cars and electric vehicles, a further gate boosting stage may be disposed between a gate driver circuit and the power transistor in order to provide enough power quickly drive the input capacitance of the switch. In some cases, the boosting stage may provide about 10 A in order to activate a corresponding switching device to handle 500 A or greater. Because hybrid and electric vehicles have very high safety standards, device protection, fault detection and redundant circuits are often employed to prevent system destruction and to ensure safe and reliable performance in a variety of different environments.

SUMMARY OF THE INVENTION

In accordance with an embodiment, a method of operating a gate driving circuit includes monitoring a signal integrity at an output of the gate driving circuit. If the signal integrity is poor based on the monitoring, output of the gate driving circuit is placed in a high impedance state and an external signal integrity failure signal is asserted.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a switch driver circuit. The invention may also be applied, however, to other types of circuits, systems, and methods director toward signal generation and/or calibration.

Electronic power switches, such as those implemented using MOSFET and IGBT power transistors, are used in many applications where electric loads are driven, such as AC motors, power supplies, and other circuits. The switches and may be controlled by pulse patterns generated by a switching control unit such as a microcontroller or other electronic components. As mentioned above, in applications that involve very high power, relatively high gate currents are used to drive such switches. For example, the gate may require a current in a range from less than 1 A to more than 10 A, or even higher, depending on the particular type of switching transistor used in the particular application. In cases where a single gate driver device is unable to deliver the gate current required by a particular switch, an external booster circuit may be used to amplify the gate driver control signals and to adapt to the characteristics of the power switches.

Figure 1A:
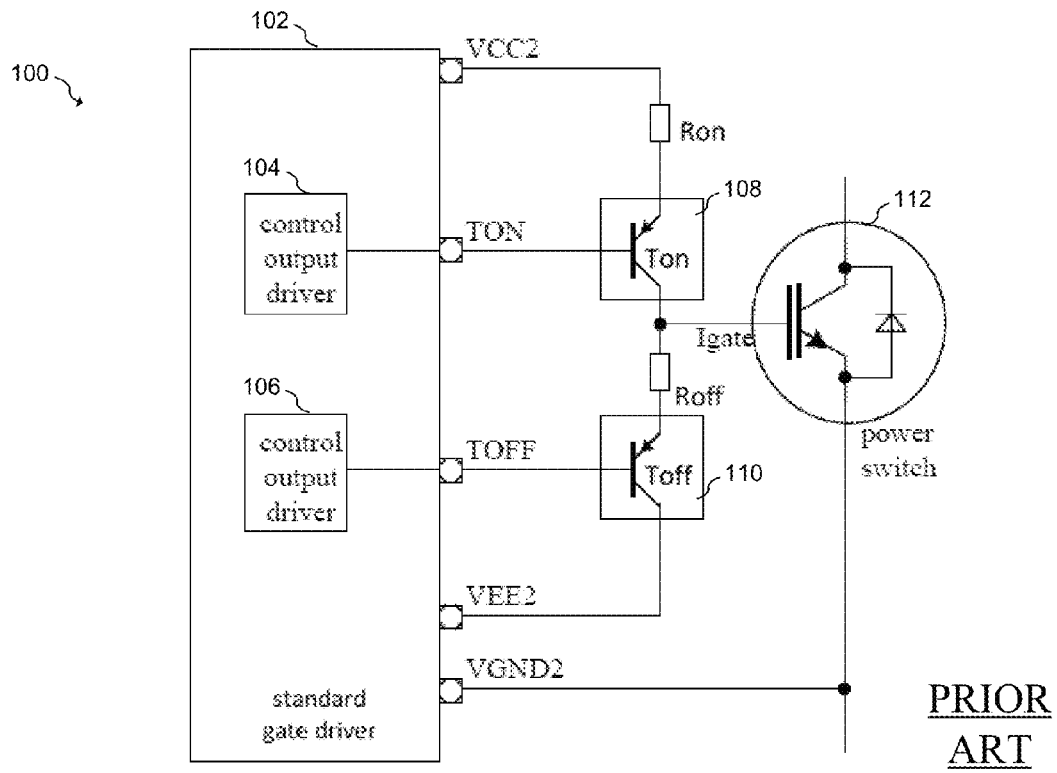
FIGS. 1a-c illustrate conventional gate driver topologies.
Figure 1B:
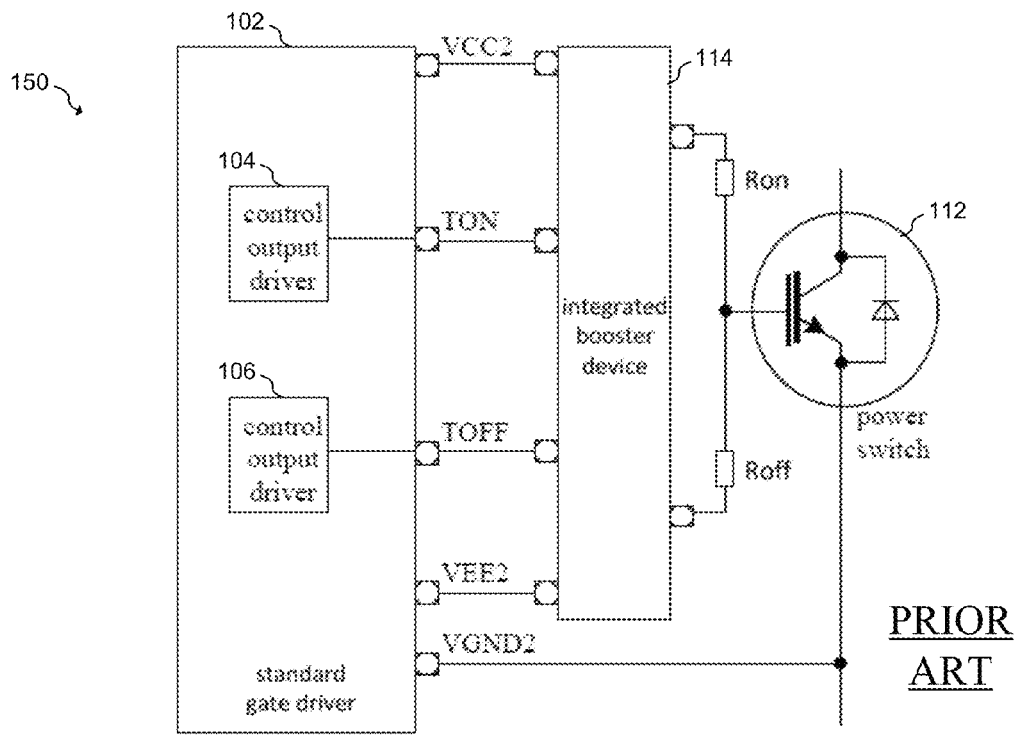

One such example of a system using an external boosting circuit is illustrated in FIG. 1a that shows gate drive system 100. Standard gate driver 102 is coupled to power transistor 112 via external Bipolar Junction Transistors (BJTs) 108 and 110. Here, two control output drivers 104 and 106 drive outputs TON and TOFF to independently control BJTs 108 and 110, respectively. Resistors Ron and Roff may also be included to independently limit drive current for turning on and off power transistor 112 and/or to modify the shape of gate drive signal Igate. Alternatively, integrated booster device 114 may be used instead of discrete BJT transistors to drive power transistor 112, as shown with respect to gate drive system 150 in FIG. 1b. Here, some or all of the components needed to drive power transistor 112 are integrated within integrated booster 114.

Figure 1C:
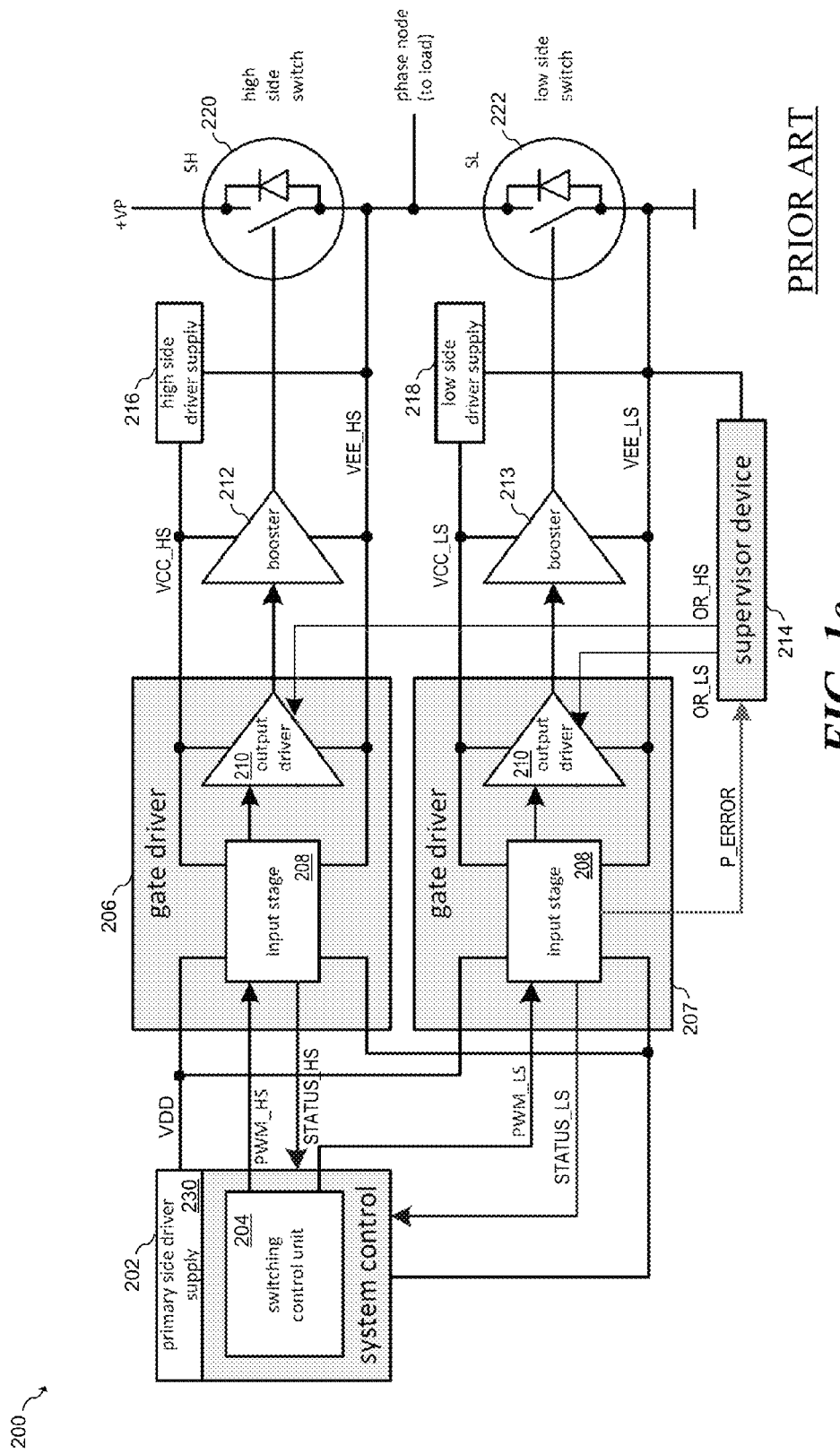

FIG. 1c illustrates system 200 for a conventional half-bridge topology in which high side switch 220 is driven by gate driver 206 and booster 212, and low side switch 222 is driven by gate driver 207 and booster 213. Booster devices 212 and 213 may be implemented using discrete components or using an integrated booster circuit as described above with respect to FIGS. 1a and 1b. System control block 202 includes primary side driver power supply 230 that provides primary side supply voltage VDD to gate drivers 206 and 207, and switching control unit 204 that provides pulsewidth modulated (PWM) signals PWM_HS and PWM_LS to high side gate driver 206 and low side gate driver 207, respectively. High side driver supply 216 provides secondary side power supply voltage VCC_HS to high side gate driver 206 and high side booster circuit 212, and low side driver supply 218 provides secondary side power supply voltage VCC_LS to low side gate driver 207 and low side booster circuit 213.

Each of gate drivers 206 contain input stage 208 and output driver 210. Input portions of input stage 208 operate on primary side power supply VDD, and output portions of input stage 208 and output driver 210 are coupled to secondary side power supply VCC_HS or VCC_LS. In many cases, circuitry coupled to primary side power supply VDD is galvanically isolated from circuit coupled to second side power supply VCC_HS or VCC_LS. In some implementations, input stage 208 may monitor the condition of primary side power supply VDD and assert signal P_ERROR if there is a loss of communication with system control block 202 and/or a loss of primary side power VDD. Input stage 208 may also generate status signals STATUS_HS or STATUS_LS to inform system control block 202 of the status of conditions such as over temperature, power switch overload, etc.

Input stage 208 handles the logic signals delivered by the system control unit, such as configuration signals, status signals, PWM signals for switching control, etc. On the other hand, output driver 210 delivers the control signals for the booster circuit to correctly drive power switch 220 or 222.

In order to meet safety requirements, such as Automotive Safety Integrity Level A (SIL), certified systems may be configured to detect system problems as they arise and protect against self-destruction of the system and its devices. As such, supervisor circuit 214 may be used to provide safety related monitoring and system control with respect to maintaining safe operation. As shown, supervisor circuit 214 is located in the same power domain as power switches 220 and 222. Supervisor circuit 214 may monitor device feedback and/or measure system values, such as temperature or load current directly. In addition, supervisor circuit 214 may be configured to force output driver 210 to output a known state when signal P_ERROR indicates that there has been a loss of primary power supply VDD or loss of communication with system control block 202 due to failure of primary power supply VDD or a bad connection.

In system 200 shown in FIG. 1c, supervisor device 214 has the ability to force output driver 210 of gate drivers 206 and 207 in a known state or in a known pattern. For example, if a failure of primary side power supply VDD is sensed, supervisor device 214 may force the output of gate drivers 206 and 207 low such that high side switch 220 is turned off and low side switch 222 is turned on.

Figure 2:
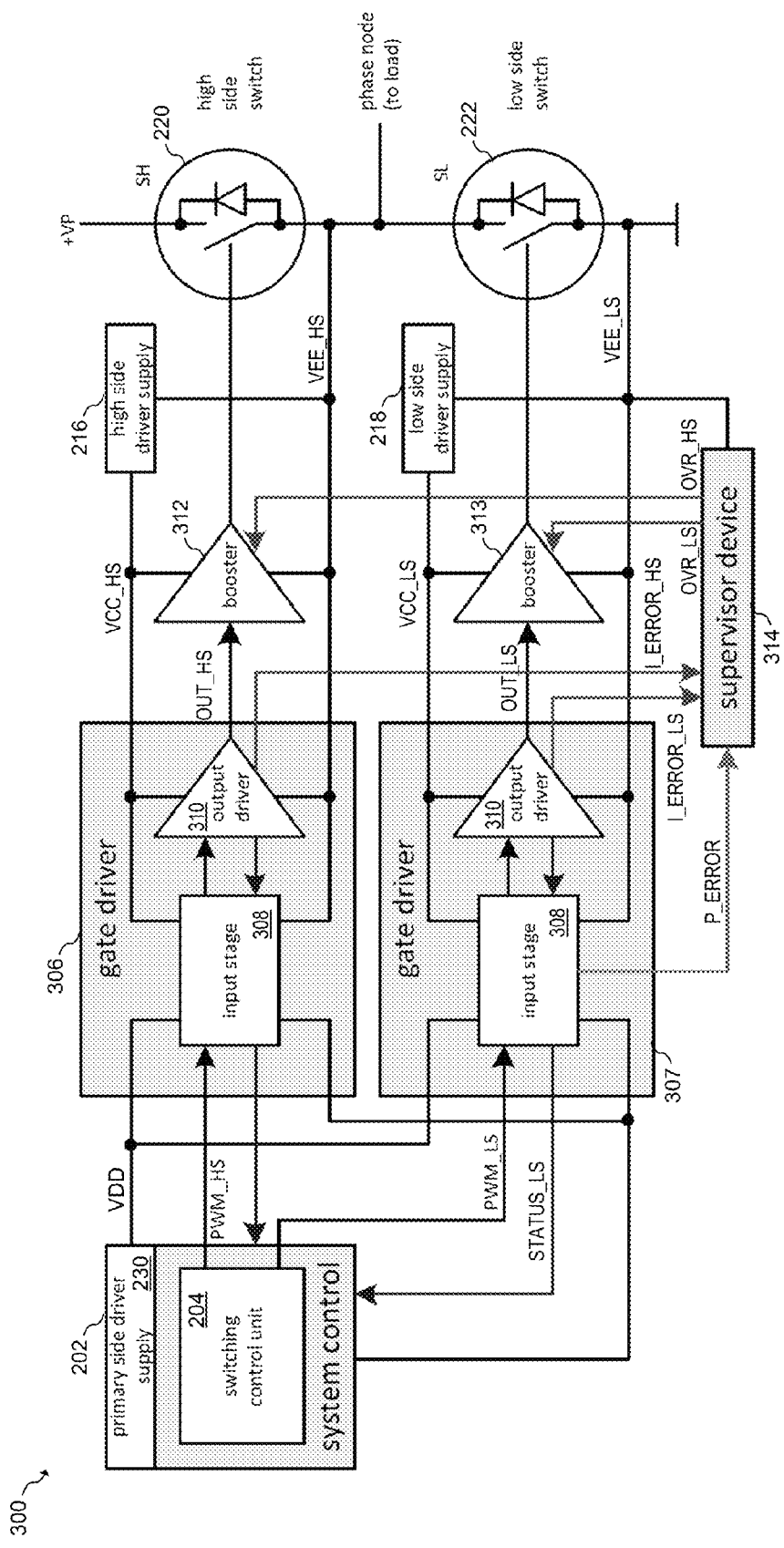
FIG. 2 illustrates an embodiment a half-bridge topology that includes a low side switch and a high side switch.

FIG. 2 illustrates embodiment half-bridge topology 300 in which high side switch 220 is driven by gate driver 306 and booster 312, and low side switch 222 is driven by gate driver 307 and booster 313. Each of gate drivers 306 and 307 are configured to monitor the signal integrity of output driver signals OUT_HS and OUT_LS, respectively in order to detect corrupted signals that may be caused by corrosion, bad solder joints, or a small piece of metal that may affect the on-board physical connections between gate driver 306 and booster 312 and between gate driver 307 and booster 313. In an embodiment, when gate driver 306 or 307 detects a loss of signal integrity, the output nodes of output drivers 310 are placed into a high-impedance state and error signal I_ERROR_HS and/or I_ERROR_LS is asserted. On receipt of one or both of these error signals, supervisor circuit 314 asserts signals OVR_HS and OVR_LS that places boosters 312 and 313 in a known output state. For example, the outputs of boosters 312 and 313 may be driven low in order to shut off output switches 220 and 222 in the event of a signal integrity failure detected at the output of either gate driver 206 or gate driver 307. In alternative embodiments, output drivers 310 may be driven in manner than a high impedance state, for example, disable the turn-on path via signal OUT_HS.

Booster devices 312 and 313 may be implemented using discrete components or an integrated booster circuit as described above with respect to FIGS. 1a and 1b. High side driver supply 216 provides secondary side power supply voltage VCC_HS to high side gate driver 306 and high side booster circuit 312, and low side driver supply 218 provides secondary side power supply voltage VCC_LS to low side gate driver 307 and low side booster circuit 313.

Each of gate drivers 306 and 307 contain input stage 308 and output driver 310. The output of each gate driver 306 and 307 may produce a single drive signal as shown, or may contain a plurality of drive signals such as TON and TOFF shown in FIGS. 1a-b. Similar to the gate driver depicted in FIG. 1c, input portions of input stage 308 operate on primary side power supply VDD, and output portions of input stage 208 and output driver 210 are coupled to secondary side power supply VCC_HS or VCC_LS. Circuitry coupled to primary side power supply VDD may be galvanically isolated from circuit coupled to second side power supply VCC_HS or VCC_LS.

Input stage 308 may monitor the condition of primary side power supply VDD and assert signal P_ERROR if there is a loss of communication with system control block 202 and/or a loss of primary side power VDD. Furthermore, gate drivers 306 and 207 measures and monitors the signal integrity of the output (OUT_HS or OUT_LS) of output driver 310. In some embodiments, signal integrity measurements may be performed by monitoring a line impedance. One way to perform such a line impedance measurement is to determine whether the voltage at OUT_HS or OUT_LS is within an expected voltage range. For example, if there is a short circuit with another signal between the gate driver output OUT_HS or OUT_LS and the booster device that is stronger than the normal load or input impedance of the booster circuits 312 or 313, an unexpected high current may occur at outputs OUT_HS or OUT_LS. In some embodiments, the detection of a high output current may also be used as an error criterion.

In the case where an unexpected impedance is detected (e.g. due to a short circuit of a gate driver control output TON or TOFF), the gate driver control outputs OUT_HS or OUT_LS are set to a state where the control of booster circuit 312 or 313 is not performed by gate driver 306 or 307. For example, the outputs of gate driver 306 and/or 307 may go into a tri-state mode or high impedance mode. As such, gate drivers 306 and 307 may be protected against short circuits conditions at its respective outputs represented by OUT_HS and OUT_LS.

In some embodiments, booster circuits 312 and 313 may have the intrinsic capability to enter a safe state without the need of the control outputs of the gate driver. This may be accomplished, for example, by using pull-up or pull-down devices at its control inputs as protection against open connections to the gate driver control outputs. Alternatively, booster circuits 312 and 313 may have an alternative control path through which supervisor device 314 may controls their output states. For example, in one embodiment, gate driver 306 or 307 may inform supervisor unit 314 via signals I_ERROR_HS or I_ERROR_LS that a problem at its control outputs has been detected and that gate driver 306 or 307 has stopped controlling its respective booster circuits 312 or 313. This information may then be used by the supervisor unit 314 to take control over the booster circuits 312 and/or 313 via alternative control path OVR_HS and/or OVR_LS.

In some embodiments, supervisor device 314 may be configured to force the output of one or both boosters 312 and/or 313 in the case of a detected failure in a single gate driver 306 or 307. For example, supervisor circuit 314 may force both boosters 312 and 313 in a known state if only gate driver 306 or only gate driver 307 indicates a signal integrity failure. Alternatively, supervisor circuit 314 may be configured to force only booster 312 into a known state if gate driver 306 detects a signal integrity failure at its output, and to force only booster 313 into a known state if gate driver 307 detects a signal integrity failure at its output.

Furthermore, a detected signal integrity failure information may also be used to change the operating mode of the system, by system control unit 202 unit and/or supervisor unit 314. In such an embodiment, a detected signal integrity failure may be signaled to system control block 202 via status buses STATUS_HS and/or STATUS_LS. In some embodiments, specific system operating modes may be forbidden depending on the detected error. For example, if a short circuit between a gate driver and a booster permanently switches off a low side gate driver of a power converter, the related gate driver may be prevented from being used for an active short circuit mode. An active short circuit mode, may be used, for example, in a three-phase inventor in which all three low side switches or all three high side switches are turned on to force a zero-vector to the power inverter, thereby protecting the power inverter from an over voltage condition in the case of a free-running motor or when a gate driver fails.

In some embodiments, switching transistors 220 and 222 may conduct between about 100 A and about 900 A of current, with a corresponding gate drive current about between about 1 A and about 10 A. Alternatively, currents outside of these ranges may be conducted. In higher current embodiments, such as those in which switching transistors 220 and 222 conduct about 900 A of current, PWM input signals PWM_HS and PWM_LS may operate at a frequencies between about 3 KHz and about 5 KHz. In more moderate current embodiments in which switching transistors 220 and 222 conduct about 100 A of current, PWM input signals PWM_HS and PWM_LS may operate at a frequencies between about 20 KHz and about 30 KHz. In alternative embodiments, other frequency ranges may be used depending on the particular system and its specifications.

Figure 3:
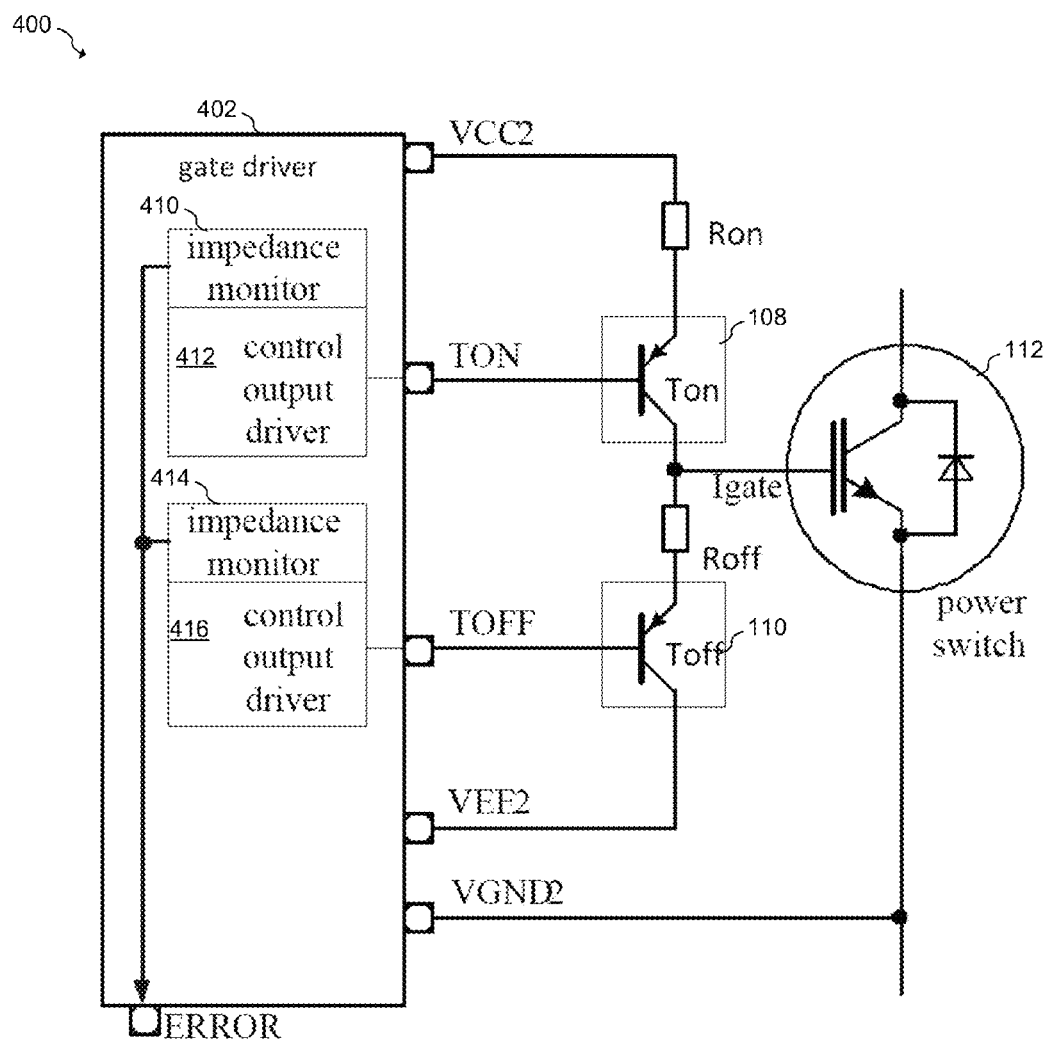
FIG. 3 illustrates an embodiment gate driver circuit.

FIG. 3 illustrates switching system 400 using embodiment gate driver 402 that is coupled to power transistor 112 via discrete BJT transistors 108 and 110. As shown, control output driver 412 drives output pin TON and impedance monitor 410 monitors the impedance of output pin TON. Similarly, control output driver 416 drives output pin TOFF and impedance monitor 414 monitors the impedance of output pin TOFF. Control output drivers 412 and 416 may be implemented using, for example, conventional output driver circuits known in the art. Impedance monitors 410 and 414 may be implemented, for example, by monitoring the voltage and current at output pins TON and TOFF. If impedance monitor 410 or 414 detects a problem with the impedance on lines TON or TOFF, control output drivers 412 and 416 drive TON and TOFF into a high impedance or tri-state condition and an error signal asserted on output signal ERROR.

Figure 4:
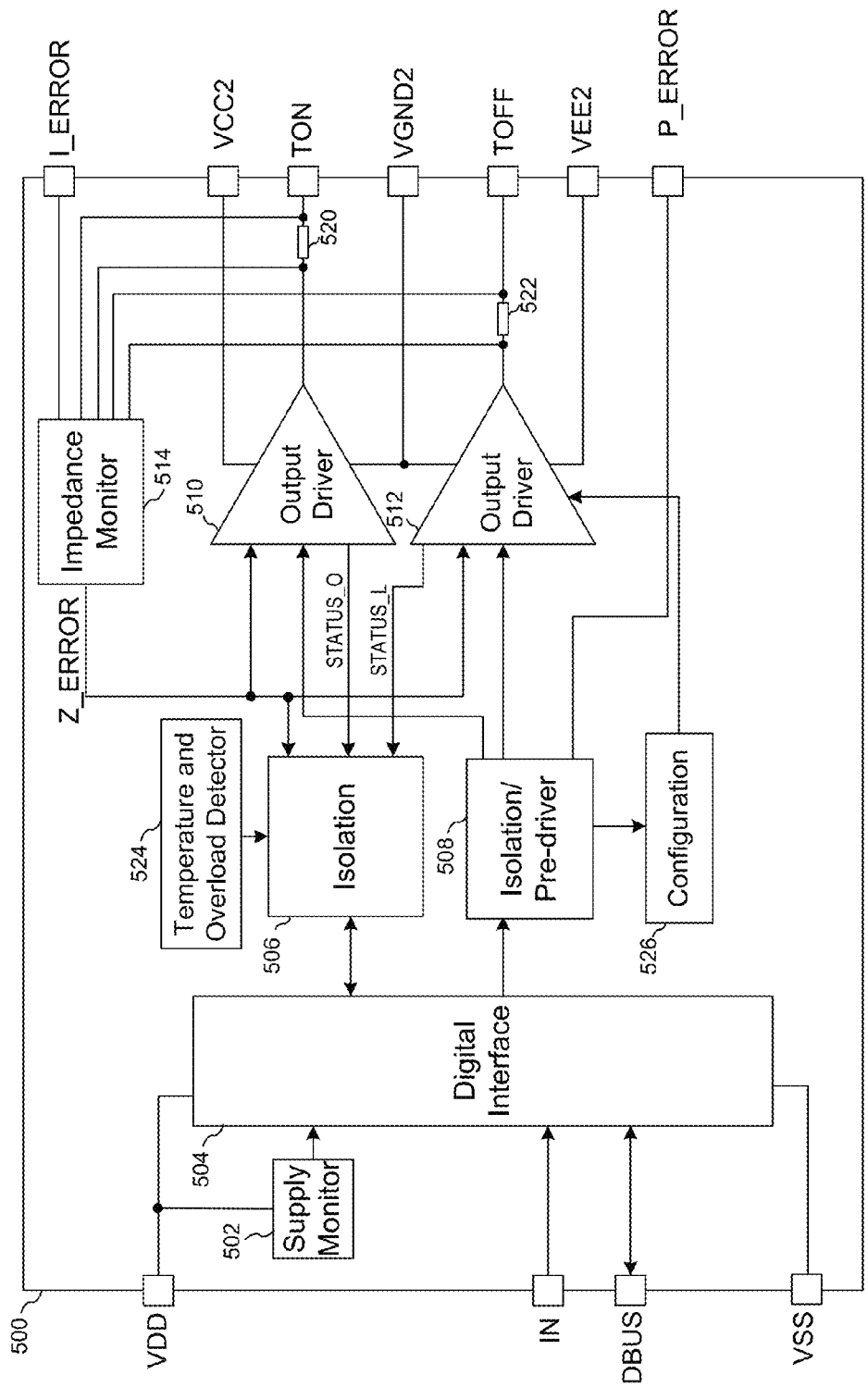
FIG. 4 illustrates a block diagram of a gate driver integrated circuit.

FIG. 4 illustrates embodiment gate driver integrated circuit 500 according to an embodiment of the present invention. Integrated circuit 500 includes digital interface 504, isolation block 506, Isolation/Pre-driver block, output drivers 510 and 512, impedance monitor 514, temperature and overload block 524 and configuration block 526. Digital interface 504 receives input signal at pin IN, which may be a pulse-width modulated signal. Digital interface 504 may further monitor primary supply pins VDD and VSS for a failure condition, in which case, error signal at pin P_ERROR is asserted. Based on the input signal at pin IN, digital interface 504 generates control signals for isolation/pre-driver circuits 506 and 508 that provide galvanic isolation between circuitry coupled to primary power supply pins VDD and VSS, and circuitry coupled to secondary power supply pins VCC2, VGND2 and VEE2. Isolation block 506 provides an isolated interface for digital control and status information to and from temperature and overload detector 524, impedance monitor 514, and output drivers 510 and 512. Isolation/pre-driver circuit 508 includes the requisite drivers and/or level shifters used to condition signals to activate output drivers 510 and 512, which drive output pins TON and TOFF. In some embodiment output drivers 510 and 512 provide status information signals STATUS_O and STATUS_L to digital interface 504 via isolation block 506, which may be accessed by an interface bus (not shown) or be used to adjust the behavior of integrated circuit 500.

Impedance monitor 514 monitors the signal integrity of pins TON and TOFF by monitoring the current and voltages at these pins. The current at pins TON and TOFF may be monitored by measuring a voltage across series resistors 520 and 522 respectively and compared to a set of predefined limits for a given measured voltage at pin TON and TOFF. For example, in one embodiment, there may be some voltage ranges of pins TON and TOFF for which there is a range of allowable currents. There may be other voltages ranges of TON and TOFF for which a current of close to 0 A is expected. If the measurements made by impedance monitor 514 fall outside of its expected ranges, an error signal at pin I_ERROR is asserted and output drivers 510 and 512 are placed into a high-impedance output state (tri-state) via signal Z_ERROR. In some embodiments, impedance monitor 514 indicates the existence of the detected impedance error to digital interface 504 via isolation block 506 so that the error may be signaled to other circuits via a digital interface bus DBUS. Digital interface bus DBUS may be implemented using a single signal, a parallel interface, or serial interface. In some embodiments, digital interface bus DBUS may be used to write or read various parameters to and from gate driver circuit 500. For example, drive strengths, operation modes and impedance monitor thresholds may be set or monitored. Primary supply monitor 502 may be used to monitor primary side power supply VDD. In the case of a supply failure, supply monitor 502 signals digital interface 504, which in turn, deactivates output drivers 510 and 512 and provides external signal P_ERROR indicating the supply failure condition via isolation block 506. In alternative embodiments, impedance monitor 514 may monitor the impedance of lines TON and TOFF by monitoring a voltage and/or and comparing the monitored voltage and/or current to expected ranges. In further embodiments, other impedance monitoring techniques known in the art may be applied.

In an embodiment, temperature and overload detector 524 may detect high temperature and overload conditions using techniques known in the art. When such conditions are detected, temperature and overload detector 524 signals isolation block 506, which may signal the overload condition to digital interface 504 and/or take corrective action such as disabling or adjusting the drive strength of output drivers 510 and 512. Configuration block 526 may be used to set configuration parameters for the output drivers 510 and 512. Configuration parameters may include, for example, drive strength, drive speed/slope, nominal driver output levels.

In an embodiment, primary power supply pin VDD may operate at voltages of, for example 3.3 V±5% or 5 V±5%; Secondary power supply pin VCC2 may operate between about 12 V and about 15 V, while secondary power supply pin VEE2 may operate at between about 0 V to about −12 V or about −15 V. Alternatively, voltages outside of these ranges may be used depending on the particular embodiment and its specifications.

Figure 5:
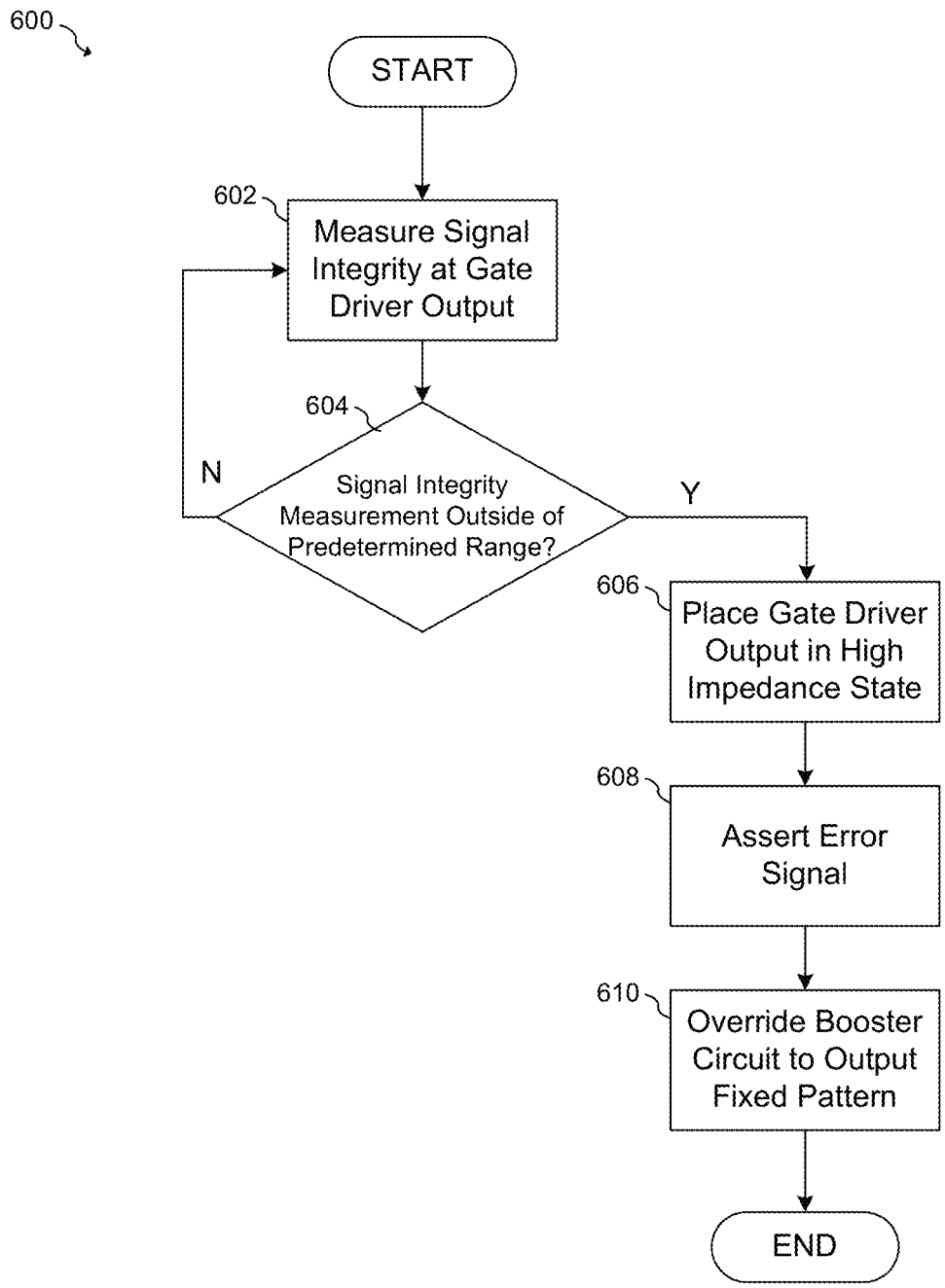
FIG. 5 illustrates a flowchart of an embodiment method.

FIG. 5 illustrates flowchart 600 of an embodiment method. In step 602, a signal integrity of a gate driver output is measured. The signal integrity may be determined, for example, by monitoring the impedance seen by the gate drive output, and/or by determining whether a voltage and/or current at the gate driver output is within a predetermined range. In some embodiments, the measurement of voltages and/or currents may be performed either statically or dynamically. In one example, the signal integrity measurement is considered outside of the predetermined range if the measured current is greater than an expected value during a transition phase of the driver. For example, when a bipolar booster stage is used, a beta, or current gain of the bipolar transistor may be between about 20 and about 50. For a booster stage output current of about 10 A with a beta of 20, a nominal current of about 500 mA may be expected at the output of the gate driver. In one embodiment, the signal integrity is assumed to fail if the current at the control output exceeds twice the expected value (i.e., 1 A) during the transition phase (charging or discharging of the gate of the power switch). With a beta of about 50, the nominal output current during a transition phase would be about 200 mA, and the signal integrity would be considered to have failed if the transition current exceeds about 400 mA. On the other hand, the signal integrity could also be considered to have failed if much less (e.g. some few mA or a value close to 0) is detected during the transition phase, thereby indicating the possibility of an open connection caused, for example, by a failed solder joint or other physical or electrical damage inflicted on the system. It should be appreciated that the above current ranges are only just examples of many possible scenarios. In alternative embodiment, other current ranges and thresholds may signify failure ranges.

In some embodiments, the length of the transition phase depends on the particular topology and technology power switch and optional gate resistor. Therefore, in some embodiments, the transition phase current is checked at a set time after the start of the transition. For example, in one embodiment, the current at the control output of the gate driver is checked at about 500 ns after the intended start of the transition phase. Alternatively, the current may be measured at different times after the start of a transition.

In one embodiment, during steady state operation of the gate of the power switch (i.e., not during a transition), nearly no current is drawn from the control output of the gate driver under normal conditions. This condition may also be monitored. A failure detected during steady state operation may signify, for example, a stuck-at error due to a short circuit to another potential.

If the signal integrity is determined to be outside of this predetermined range (step 604), for example by determining that the gate driver output impedance, voltage and/or current is outside of the particular predetermined ranges, the gate driver output is placed in a high output impedance state in step 606. This may be accomplished, for example, by turning off output transistors. Next, in step 608, an error signal is asserted. This error signal may be routed to a supervisor circuit or to a system controller. The error signal may take the form of a single digital signal line or may take the form of a bit within a status word that is transmitted on a serial or parallel digital bus. In some embodiments, steps 606 and 608 may occur concurrently, and or step 608 may occur before step 606. In step 610, the output of an external booster circuit is overridden and configured to output a fixed pattern. In some embodiments, this step is accomplished by a supervisor circuit asserting an override signal to one or more booster circuits. In one embodiment, the fixed pattern may be configured to shut down output switches or transistors that are couple to the output of the booster circuits.

In accordance with an embodiment, a method of operating a gate driving circuit includes monitoring a signal integrity at an output of the gate driving circuit. If the signal integrity is poor based on the monitoring, output of the gate driving circuit is placed in a high impedance state and an external signal integrity failure signal is asserted. The method may further includes monitoring an input pin, generating a switching output signal based monitoring the input pin, and providing the switching output signal to switch via a booster circuit.

In an embodiment, monitoring the signal integrity comprises detecting an impedance of the output of the gate driving circuit. This impedance may be detected, for example, by determining whether a voltage of the output of the gate driving circuit is within a first voltage range. The impedance may also be detected by measuring a voltage at an the output of the gate driving circuit, measuring a current at the output of the gate driving circuit, and determining whether the measured current is within a first current range. The first current range may be based on the measured voltage at the output of the gate driving circuit.

In an embodiment, the method also includes providing the external signal integrity failure signal to a supervisory circuit, providing the output of the gate driving circuit to a booster circuit. The booster circuit may be placed in a first state when the external signal integrity failure signal is asserted, which may be performed by the supervisory circuit via an alternative signal path in the booster circuit.

The method may further include detecting a primary side power failure on the gate driving circuit, and asserting a primary side power failure indication signal when a primary side power failure is detected. The booster circuit may be placed in a first state when primary side power failure is asserted.

In accordance with a further embodiment, a gate driver circuit includes an output driver, and a signal integrity monitoring circuit coupled to an output of the output driver. The signal integrity monitoring circuit is configured to assert a first error signal and to place the output driver in a high-output impedance mode when a signal integrity fault is detected at the output of the output driver. The signal integrity monitoring circuit may be configured to detect the signal integrity fault by determining whether an impedance of the output of the output driver is within a first impedance range. In an embodiment, the output driver includes a turn-on path and a turn-off path, and the signal integrity signal integrity monitoring circuit is coupled to an output of the turn-on path and to an output of the turn-off path. Furthermore, the first error signal may be configured to be coupled to a supervisory circuit.

In an embodiment, the gate driver circuit further includes a digital interface coupled to an input, and a galvanic isolation circuit coupled between the digital interface and an input node of the output driver. The gate driver circuit may further include a digital interface configured to output status information regarding the gate driver, such that the status information comprises signal integrity information derived from the signal integrity monitoring circuit.

The gate driver may be further configured to detect a state of a power supply node coupled to the gate driver circuit, and assert a second error signal when a voltage of the power supply node is outside of a defined operating range. The output driver may be further configured to be coupled to a switch via a booster circuit and/or may be disposed on an integrated circuit.

In accordance with a further embodiment, a switching system includes a semiconductor switch, a boosting circuit having an output node coupled to a control node of the semiconductor switch, and a gate driving circuit, which includes an output driver and a signal integrity monitoring circuit. The output driver has an output coupled to an input of the boosting circuit, and the signal integrity monitoring circuit is coupled to the output of the output driver. In an embodiment, the signal integrity monitoring circuit is configured to assert a first error signal and to place the output driver in a high-output impedance mode when a signal integrity fault is detected at the output of the output driver. The switch system further includes a supervisor circuit having a first output coupled to an alternate input of the boosting circuit and a line integrity fault input coupled to the first error signal. The supervisor circuit may be configured to place the boosting circuit in a first output state when the first error signal is asserted.

In an embodiment, the gate driving circuit further includes a power supply monitoring circuit, and a second error signal output configured to become asserted when the power supply monitoring circuit detects a power supply fault. The power supply fault may be, for example, a primary-side power supply fault.

An advantage of some embodiments include the ability to monitor and provide corrective action for loss of signal integrity at the output of gate driving circuitry when a booster circuit is coupled between the gate driving circuitry and a switching transistor. Further advantages include the ability to control low-side and high-side output drivers differently in the case of an error condition. For example, in one condition, all high-side switches may be turned on and all low-side switches may be turned off.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a gate driving circuit, the method comprising:
    performing a signal integrity measurement at an output of the gate driving circuit;
    if the signal integrity is measurement is outside of a predetermined range, placing the output of the gate driving circuit in a high impedance state and asserting an external signal integrity failure signal;
    monitoring an input pin;
    generating a switching output signal based monitoring the input pin; and
    providing the switching output signal to switch via a booster circuit.

2. The method of claim 1, wherein performing the signal integrity measurement comprises detecting an impedance of the output of the gate driving circuit.

3. A method of operating a gate driving circuit, the method comprising:
    performing a signal integrity measurement at an output of the gate driving circuit; and
    if the signal integrity is measurement is outside of a predetermined range, placing the output of the gate driving circuit in a high impedance state and asserting an external signal integrity failure signal, wherein
    performing the signal integrity measurement comprises detecting an impedance of the output of the gate driving circuit, and
    detecting the impedance of the output of the gate driving circuit comprises determining whether a voltage of the output of the gate driving circuit is within a first voltage range.

4. The method of claim 2, wherein detecting the impedance of the output of the gate driving circuit comprises:
    measuring a voltage at an the output of the gate driving circuit;
    measuring a current at the output of the gate driving circuit; and
    determining whether the measured current is within a first current range.

5. A method of operating a gate driving circuit, the method comprising:
    performing a signal integrity measurement at an output of the gate driving circuit; and
    if the signal integrity is measurement is outside of a predetermined range, placing the output of the gate driving circuit in a high impedance state and asserting an external signal integrity failure signal, wherein performing the signal integrity measurement comprises detecting an impedance of the output of the gate driving circuit, and detecting the impedance of the output of the gate driving circuit comprises
    measuring a voltage at an the output of the gate driving circuit,
    measuring a current at the output of the gate driving circuit, and
    determining whether the measured current is within a first current range, wherein the first current range is based on the measured voltage at the output of the gate driving circuit.

6. A method of operating a gate driving circuit, the method comprising:
    performing a signal integrity measurement at an output of the gate driving circuit;
    if the signal integrity is measurement is outside of a predetermined range, placing the output of the gate driving circuit in a high impedance state and asserting an external signal integrity failure signal;
    providing the external signal integrity failure signal to a supervisory circuit; and
    providing the output of the gate driving circuit to a booster circuit.

7. The method of claim 6, further comprising placing the booster circuit in a first state when the external signal integrity failure signal is asserted.

8. The method of claim 7, wherein the placing the booster circuit in the first state is performed by the supervisory circuit via an alternative signal path in the booster circuit.

9. The method of claim 6, further comprising:
    detecting a primary side power failure on the gate driving circuit; and
    asserting a primary side power failure indication signal when a primary side power failure is detected.

10. The method of claim 9, further comprising placing the booster circuit in a first state when primary side power failure is asserted.

11. A gate driver circuit comprising:
    an output driver; and
    a signal integrity monitoring circuit coupled to an output of the output driver, the signal integrity monitoring circuit configured to assert a first error signal and to place the output driver in a high-output impedance mode when a signal integrity fault is detected at the output of the output driver, wherein the signal integrity monitoring circuit is configured to detect the signal integrity fault by determining whether an impedance of the output of the output driver is within a first impedance range.

12. A gate driver circuit comprising:

an output driver; and a signal integrity monitoring circuit coupled to an output of the output driver, the signal integrity monitoring circuit configured to assert a first error signal and to place the output driver in a high-output impedance mode when a signal integrity fault is detected at the output of the output driver, wherein the output driver comprises a turn-on path and a turn-off path, and the signal integrity signal integrity monitoring circuit is coupled to an output of the turn-on path and to an output of the turn-off path.

13. The gate driver circuit of claim 11, wherein the first error signal is configured to be coupled to a supervisory circuit.

14. A gate driver circuit comprising:

an output driver;

a signal integrity monitoring circuit coupled to an output of the output driver, the signal integrity monitoring circuit configured to assert a first error signal and to place the output driver in a high-output impedance mode when a signal integrity fault is detected at the output of the output driver;

a digital interface coupled to an input; and a galvanic isolation circuit coupled between the digital interface and an input node of the output driver.

15. A gate driver circuit comprising:

an output driver;

a signal integrity monitoring circuit coupled to an output of the output driver, the signal integrity monitoring circuit configured to assert a first error signal and to place the output driver in a high-output impedance mode when a signal integrity fault is detected at the output of the output driver;

a digital interface configured to output status information regarding the gate driver; and the status information comprises signal integrity information derived from the signal integrity monitoring circuit.

16. The gate driver of claim 11, wherein the gate driver is further configured to:

detect a state of a power supply node coupled to the gate driver circuit; and assert a second error signal when a voltage of the power supply node is outside of a defined operating range.

17. The gate driver circuit of claim 11, wherein the output driver is configured to be coupled to a switch via a booster circuit.

18. The gate driver circuit of claim 11, wherein the gate driver circuit is disposed on an integrated circuit.

19. A switching system comprising:

a semiconductor switch;

a boosting circuit having a output node coupled to a control node of the semiconductor switch;

a gate driving circuit comprising:

an output driver having an output coupled to an input of the boosting circuit, an signal integrity monitoring circuit coupled to the output of the output driver, wherein the signal integrity monitoring circuit configured to assert a first error signal and to place the output driver in a high-output impedance mode when a signal integrity fault is detected at the output of the output driver; and a supervisor circuit having a first output coupled to an alternate input of the boosting circuit, and a line integrity fault input coupled to the first error signal, the supervisor circuit configured to place the boosting circuit in a first output state when the first error signal is asserted.

20. The system of claim 19, wherein:

the gate driving circuit further comprises a power supply monitoring circuit; and the gate driver circuit further comprises a second error signal output configured to become asserted when the power supply monitoring circuit detects a power supply fault.

21. The system of claim 20, wherein the power supply fault is a primary-side power supply fault.

* * * * *